United States Patent
Migitaka et al.

(10) Patent No.: US 6,790,564 B2
(45) Date of Patent: Sep. 14, 2004

(54) PHOTOMASK AND MANUFACTURING METHOD OF AN ELECTRONIC DEVICE THEREWITH

(75) Inventors: Sonoko Migitaka, Kodaira (JP); Tadashi Arai, Kumagaya (JP); Tsutomu Araki, Kodaira (JP); Satoshi Momose, Higashiyamato (JP); Osamu Yamaguchi, Takasaki (JP)

(73) Assignee: Renesas Technology Corporation, Tokyo (JP)

( * ) Notice: Subject to any disclaimer, the term of this patent is extended or adjusted under 35 U.S.C. 154(b) by 294 days.

(21) Appl. No.: 10/020,904

(22) Filed: Dec. 19, 2001

(65) Prior Publication Data

US 2002/0086222 A1 Jul. 4, 2002

(30) Foreign Application Priority Data

Dec. 25, 2000 (JP) ........................................ 2000-391795

(51) Int. Cl.[7] ................................................ G03F 9/00
(52) U.S. Cl. ........................................... 430/5; 430/322
(58) Field of Search ............................. 430/5, 311, 313, 430/322, 270.1, 945, 296, 942

(56) References Cited

U.S. PATENT DOCUMENTS 6,617,265 B2 * 9/2003 Tanaka et al. .............. 438/782

FOREIGN PATENT DOCUMENTS

| JP | 04-136854 | 9/1990 |
|---|---|---|
| JP | 05-289307 | 4/1992 |

* cited by examiner

*Primary Examiner*—Kathleen Duda
(74) *Attorney, Agent, or Firm*—Reed Smith LLP; Stanley P. Fisher, Esq.; Juan Carlos A. Marquez, Esq.

(57) ABSTRACT

In the step of manufacturing a photomask, an opaque pattern is formed by using a photosensitive resin composition containing a specified light absorbent, which then used to manufacture a photomask for KrF excimer laser lithography in a short manufacturing time and at a reduced cost. Accordingly, the manufacturing time and the cost for semiconductor integrated circuit devices is reduced.

9 Claims, 4 Drawing Sheets

PHOTOMASK AND MANUFACTURING METHOD OF AN ELECTRONIC DEVICE THEREWITH

BACKGROUND OF THE INVENTION

1. Field of the Invention

The present invention relates to a method of manufacturing an electronic device such as a semiconductor integrated circuit, a super conductive device, a micro-machine, TFT, or a printed wiring board. In particular, the invention relates to a technique effectively applicable to lithography in the manufacturing process of the semiconductor integrated circuit device.

2. Description of Related Art

In the production of semiconductor integrated circuit devices, lithography is used for transferring a fine pattern on a semiconductor wafer. In the lithography, a projection and exposure system is used and a device pattern is formed by transferring a pattern of a photomask mounted on the projection and exposure system to the semiconductor wafer.

A usual photomask is prepared by fabricating a shade material, such as chromium (Cr) formed on a transparent quartz glass substrate. That is, a shade film made of chromium or the like is formed in a desired shape on a quartz substrate. The shade film is fabricated, for example, as described below. That is, after coating an electron beam sensitive resist on a shade film, a desired pattern is delineated on the electron beam sensitive resist by an electron beam exposure system. Successively, after delineating a resist pattern of a desired shape by development, the shade film is fabricated by dry etching or wet etching using the resist pattern as a mask. Subsequently, after removing the resist, cleaning is conducted to form an opaque pattern of a desired shape on the quartz glass substrate.

In recent years, with an aim of improving the resolution of lithography, various mask structures have been proposed in addition to usual photomasks in which the shade film comprises a chromium or the like in a desired shape as described above. For example, in JP-A-136854/1992, the shade film of the photomask is made semi-transparent and the phase of slight light transmitting the semi-transparent area is inverted to transmit the transparent pattern. That is, the light at a level lower than the sensitivity of a photoresist for transferring the pattern is transmitted through the semi-transparent film and the phase of the light transmitting through the transparent pattern is inverted. Since the phase of the light transmitting via the semi-transparent film is inverted relative to the light transmitting the transparent pattern as a main pattern, the phase is inverted at the boundary and the intensity of light at the boundary approaches zero. Thus, the ratio between the intensity of light passing the transparent pattern and the intensity of light at the boundary of the pattern is relatively increased to obtain a distribution of light intensity with higher contrast compared with the technique not using the semi-transparent film. This is referred to as a half tone type phase shift mask. In the manufacture of the half tone phase shift mask, the shade film of the usual photomask is changed to a half tone phase shift film, which is manufactured substantially in the same step as the manufacturing step for the usual photomask.

Further, there is an exposure method referred to as resolution enhancement which provides patterning resolution much smaller than the exposure wavelength. Among the resolution enhancement processes, a Levenson-type phase shifting exposure process is most effective for forming a fine pattern. In the Levenson-type phase shifting exposure process, a structure called as a phase shifter for inverting the phase of the irradiation light is formed alternately in the irradiation light transmitting area, i.e., in the window where the glass surface is exposed of a usual photomask while the shade are putted therebetween is exposed by using the photomask. Since phase of lights transmitting both of the transmitting areas is inverted, a region where the amplitude of light is reduced to zero is formed in the sandwiched shade area. When the amplitude is zero, the intensity of light is also reduced to zero, and the resolution is improved significantly by about ½ of the exposure wavelength for the alternately arranged shade area (thinner than the window) and the phase shifter area. The photomask having such a shade area and a phase shifter area is referred to as a Levenson-type phase shift mask.

Due to increasing accuracy and versatile arrangements of semiconductor integrated circuit devices, the fabrication accuracy for the photomask used in the lithography also in the usual photomask becomes more stringent. Therefore, a phase shift mask having the special structure as described above becomes necessary. Accordingly, the production cost for such photomasks of about 20 to 40 plates are much more expensive, and the time required for the manufacture of the photomask becomes longer.

On the other hand, JP-A-289307/1993 discloses a method for forming a shade film in the photomask with a resist film instead of existent metal films such as of Cr. This method utilizes benzene (rings) as the main constituent element in a usual electron beam resist or photosensitive resist compositions because that they have an extremely large light absorption band at a wavelength of an ArF excimer laser beam source (about 193 nm). The etching step for the shade film or the resist removing step is not necessary according to this method, which reduces the cost, improves the dimensional accuracy, and reduces the defects of the photomask. In many existent high performance resists used in the KrF excimer laser lithography or electron beam lithography, phenolic polymer resins or derivatives thereof are used for the base polymer matrix providing the coatability. An aromatic ring (benzene ring) structure in such resins has an extremely large absorption maximum near the wavelength of the ArF excimer laser beam, and the transmittance at the wavelength of 193 nm is 1% or less with a film thickness only of 0.1 $\mu$m in such a resin coating layer. Accordingly, in the resist material using the resin described above as the matrix, the transmittance to the ArF excimer laser beam is 0.01% or less even at the film thickness of about 0.3 $\mu$m which is used frequently, which provides a substantially ideal shade film. However, the transmittance of such resin increases near the wavelength of the existent KrF excimer laser beam (about 248 nm) and the transmittance is 30% or more even at the film thickness for forming a fine pattern (usually about 0.3 to 1.0 $\mu$m). Accordingly, such a resist can not be used for the shade film of the photomask in KrF excimer laser lithography.

The technique described above for forming the shade film in the photomask with a resist film of large light absorption at the exposure wavelength (instead of an existent metal film such as made of Cr) creates problems, and countermeasures therefor in the prior art to the photomask for the existent KrF excimer lithography are not disclosed. The subject of this invention is to provide a photomask for KrF excimer laser lithography using an opaque pattern that utilizes the light absorption characteristic of the organic resin composition, and to provide a method applying such a mask to produce semiconductor devices. The KrF excimer laser lithography is an exposure method used in a volume zone of semiconductor devices, and producing semiconductor devices by the KrF excimer laser lithography with such a mask reduces cost, and provides a high accuracy and less defect density.

In various existent kinds of high performance resists, the transmittance is 30% or more near the wavelength of the KrF excimer laser beam (about 248 nm) at a film thickness for forming a fine pattern (usually about 0.3 to 1.0 μm). Accordingly, the resists described above can not be used as they are for the shade film of the photomask for KrF excimer laser lithography. An obvious countermeasure is to incorporate a compound or a chemical structure having an absorption band in a wavelength region of a KrF excimer laser beam into an existent resist composition of high resolution. However, a light absorption compound that can be incorporated in the composition without greatly deteriorating the resolution performance or the like was not yet known. It is a subject of this invention to provide a resist composition that enables a resist pattern to be formed directly on a quartz glass substrate as a photomask (a shade film) for KrF excimer laser lithography, as well as to manufacture a photomask for KrF excimer laser lithography with the resist composition.

Further, in the prior art, a resist pattern of extremely low transmittance substantially equivalent with a metal shade film, such as made of Cr, can be used as a shade film but not as a half tone film. That is, it is also a subject of this invention to provide a method of using a resist pattern formed directly on a quartz glass substrate as an attenuator to the phase shift mask, such as a half tone type phase shift mask, in the KrF excimer laser lithography.

The shade film with light absorption characteristic made of the organic resin composition suffers a greater restriction of durability, such as light stability, in comparison with a shade film comprising metal film, such as of Cr, in a usual photomask. The prior art provides a method for improving the durability by the heat treatment after the formation of the pattern. The present inventors have studied the light stability of an organic resin composition shade film utilizing the light absorption characteristic in the KrF excimer laser exposure system and found that the organic polymer layer having a light absorption band at an exposure wavelength inevitably suffer from change due to any photochemical reaction in an exposure environment for a long period of time. Accordingly, a new subject of this invention is to provide a method of effectively using a photomask having an organic resin composition shade film without suffering from the change of photochemical reaction and, particularly, a method of effectively using the mask to produce semiconductor integrated circuit devices.

SUMMARY OF THE INVENTION

This invention provides a photomask for KrF excimer laser lithography using an opaque pattern that utilizes the light absorbing characteristic of an organic resin composition so as to apply the photomask effectively to produce semiconductor devices.

A. It has been found that a light sensitive resin composition containing at least one of light absorption compounds represented by the following general formulae (1)–(8) can be used for the photosensitive polymer layer capable forming a resist pattern to be applied to a photomask for KrF excimer laser lithography instead of the opaque pattern comprising a metal film such as of Cr. "Containing" means herein that the compound is blended as one of ingredients of the composition, as well as it is chemically bonded previously to other composition.

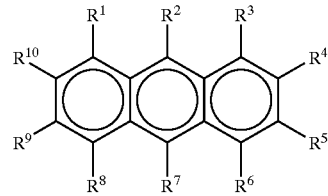
(1)

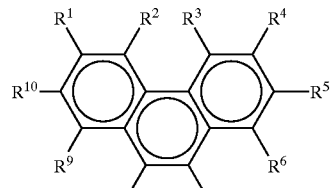
(2)

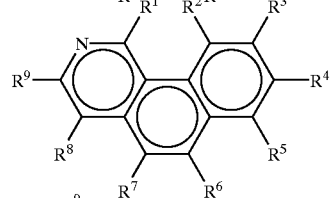
(3)

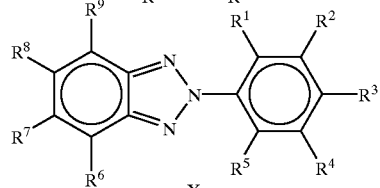
(4)

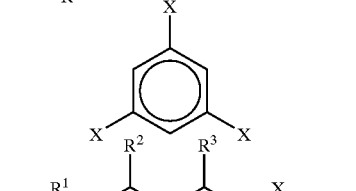
(5)

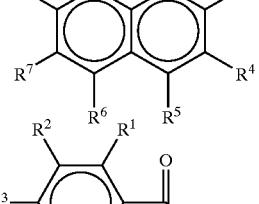
(6)

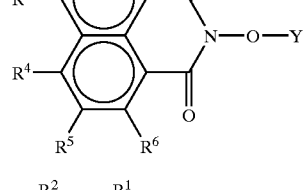
(7)

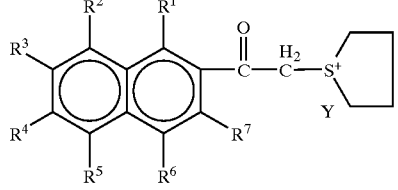
(8)

where $R^1$ to $R^{10}$ each represents an atom or atom group selected from the group consisting of hydrogen, a substituted or non-substituted alkyl group of 1 to 4 carbon atoms, a halogen, a hydroxy group, a methylol group, a substituted or non-substituted alkoxy group of 1 to 4 carbon atoms, a hydroxyl group, a phenyl group, a methoxy group, an ethoxyethyl group, a cyclopropyl group, an acetal group and an acetyl group. $R^1$ to $R^{10}$ may be identical to or different from one another. X represents a halogenated acetyl group, and Y represents an atom or an atom group selected from a group consisting of camphor sulfonate, trifluoro sulfonate and methane sulfonate.

More specifically, the compound may include, for example, anthracene, anthrarobin, benzoquinoline, phenantol, 1-methoxy-9,10-dibromoanthracene, 2-hydroxymethyl anthracene, 9-hydroxymethyl anthracene, 9-bromoanthracene, 9-chloromethyl anthracene, methoxymethyl anthracene, 1-amino anthracene, acetoxy anthracene, 2-bromoacetyl naphthalene, 2-bromoacetyl-6,7-dimethoxy naphthalene, 1-hydroxy-4-bromo-2-bromoacetyl naphthalene, 1,3,5-tris(bromoacetyl)benzene, 3-bromoacetyl cumarin and 3-bromomethyl-7-methoxy-1,4-benzoxadine-2-one.

The content of the light absorption compound in the composition and the film thickness are adjusted such that the transmittance of the thus formed opaque pattern to a KrF excimer laser beam is 1% or less, preferably 0.5% or less, and the composition is used as a photomask for KrF excimer laser lithography.

B. The photosensitive resin composition with the light absorption compound described above is applicable also to manufacture a half tone type phase shift mask for the KrF excimer laser lithography. The content of the light absorption compound in the composition and the film thickness are controlled such that the transmittance of the thus formed opaque pattern to a KrF excimer laser beam ranges from 2% to 16%, preferably 4% to 9%. The phase difference of the irradiation light transmitting the film to that of the transmission area is either $\pi$ or $3\pi$, and the composition is used as the half tone type phase shift mask for KrF excimer laser lithography.

C. The negative type photosensitive resin composition according to this invention, may be used as any known chemical amplification type negative resist compositions. A typical amplification type negative resist composition includes an aqueous alkali soluble resin, an acid catalyst crosslinker, and an acid generator. In the negative type photosensitive composition according to this invention, the light absorption compound shown in the above (1) is blended to the composition described above. Phenolic resins, such as novolak, resin and polyhydroxy styrene, as well as various phenolic compounds, can also be used as the organic alkali soluble resin so long as they can be dissolved in a solvent to form a film by spin coating. As the acid catalyst dissolution inhibition precursors (DIPs), hexamethoxy methyl melamine (HMMM) or the like crosslinkers are known. In addition, primary to tertiary alcohols having hydroxy groups on carbon atoms bonded directly to an aromatic ring can be used as DIPs. For example, m-xylene glycol, p-xylene glycol, 1,2,3-benzene tirmethanol, 2-hydroxy-5-methyl-1,3-benzene dimethanol, 3,5,3',5'-hexahydroxymethyl-4,4-dihydroxydiphenyl, bis(3,5-dihydroxymethyl-4-hydroxyphenyl)methylene, 2,2-bis(3,5-dihydroxymethyl-4-hydroxyphenyl)propane, 1,4-bis(2-(3,5-dihydroxymethyl-4-hydroxyphenyl)propane)benzene, 1,3-bis(2-hydroxy-2-propyl)benzene, 1,3-bis(3-hydroxy-3-pentyl)benzene, 1,3-bis(2-hydroxy-2-propyl)-5-methoxybenzene, 5-chloro-1,3-bis(2-hydroxy-2-propyl)benzene, 5-bromo-1,3-bis(2-hydroxy-2-propyl)benzene, 1,4-bis(2-hydroxy-2-propyl)benzene, 1,4-bis(3-hydroxy-3-pentyl)benzene, 1,4-bis(2-hydroxy-2-propyl-2,3,5,6-tetramethyl)benzene, 2-chloro-1,4-bis(2-hydroxy-2-propyl) benzene, 2-bromo-1,4-bis(2-hydroxy-2-propyl)benzene, 1,3,5-tris(2-hydroxy-2-propyl)benzene, 1,3,5-tris(3-hydroxy-3-pentyl)benzene, 1,5-bis(2-hydroxy-2-propyl) naphthalene, 1,4-bis(2-hydroxy-2-propyl)naphthalene, or 9,10-bis(2-hydroxy-2-propyl)anthracene. The acid generator may include non-metal type onium salt (such as triphenyl sulfonium trifluoromethane sulfonate), diphenyl iodonium trifluoromethane sulfonate, and di-tert-butylphenyl iodonium methane sulfonate, sulfonate ester (such as p-toluene sulfonate-o-dinitrobenzyl, tris(methanesulfonyloxy) benzene), and tris(ethanesulfonyloxy)benzene and sulfonate imide (such as trifluoromethane sulfonate naphthylimide), and organic halogenide (such astris(2,3-dibromopropyl) isocyanurate).

D. The light absorption compound for providing the light sensitive resin composition according to this invention with a light absorption band can include those compounds described in the above (1). Particularly, anthracene derivative or phenanthrene derivative is more effective. This is because the molecular structure of anthracene or phenanthrene has a particularly large absorption band in a wavelength region of a KrF excimer laser beam.

E. Among all, for the negative type photosensitive resin composition described in the above (3), it is effective to use an anthracene derivative or a phenanthrene derivative having at least one carbinol group, for example, methylol group in the molecular structure. Most of the various kinds of high performance resists developed in recent years are so-called chemical amplification type resists which utilizes acid catalyst reaction for delineating patterns. Among all, in the negative type resist, it has been generally known to utilize an acid generated by pattern exposure from an acid generator in the composition as a catalyst in a crosslinking reaction. When an anthracene derivative or a phenanthrene derivative having the carbinol group is present in the negative type resin composition, the methylol structure at the carbinol terminal effectively bonds the anthracene derivative or the phenanthrene derivative to the matrix by the acid catalyst. This can prevent the light absorption in the process, such as coating or baking, from being lowered.

F. Among the photosensitive compositions according to this invention, a composition in which the transmittance of the opaque pattern to a KrF excimer laser beam is 1% or less, preferably 0.5% or less, is also used to form an opaque pattern in the Levenson-type phase shift mask.

G. In the projection exposure method for producing semiconductor integrated circuit devices, the photomask is exposed for a long period of time such that the organic resin opaque pattern having a light absorption band at the wavelength of the irradiation light inevitably suffers from change in the photochemical reaction. Then, for effectively using the photomask having the organic resin composition shade film to produce semiconductors, it is effective in reducing production cost to apply the same to a selected portion of photomasks (in about 20 to 40 plates for producing a kind of semiconductor integrated circuit devices). For example, in the semiconductor integrated circuit device referred to as a system LSI, since the gate processing step at the level of transistor devices has high density/compactness and high accuracy, and the kind of system LSIs is common for various customers, both of the usual photomasks having an opaque pattern of metal, such as Cr, or an expensive phase shift masks having durability can be used. However, in the processing of wiring layers, specifications are different for each customer, and the number of exposure steps used for the processing is small in most cases. When the photomask for KrF excimer laser lithography according to this invention is applied to such wiring steps, the production cost of the system LSI is reduced effectively. In the same manner, the half tone type phase shift mask or the Levenson-type phase shift mask according to this invention can also be used selectively for the steps to reduce the production cost of various semiconductor devices effectively.

H. As a matter of fact, the above-mentioned selective use depending on the layers to be processed is applicable not only for the various photomasks for KrF excimer laser lithography but also for the photomasks for ArF excimer laser lithography, especially for the wiring layer processing. For example, various kinds of system LSIs can be produced at a reduced cost effectively by using the mask for use in an ArF excimer laser lithography in which the opaque pattern comprises a metal film or a usual electron beam resist for the exposure up to the step of forming the gate electrode and by using the photomask for KrF excimer laser lithography according to this invention for processing upper layers.

I. It is also possible to use the Levenson-type phase shift mask with an organic polymer layer as the shade film of this invention as a photomask for use in the transistor gate electrode step instead of the exposure photomask for the ArF excimer laser lithography in which the opaque pattern comprises a metal film.

Other and further objects, features and advantages of the invention will appear more fully from the following description.

BRIEF DESCRIPTION OF THE DRAWINGS

Preferred embodiments of the present invention are illustrated in the accompanying drawings in which.

DETAILED DESCRIPTION OF THE PREFERRED EMBODIMENTS

Figure 1:
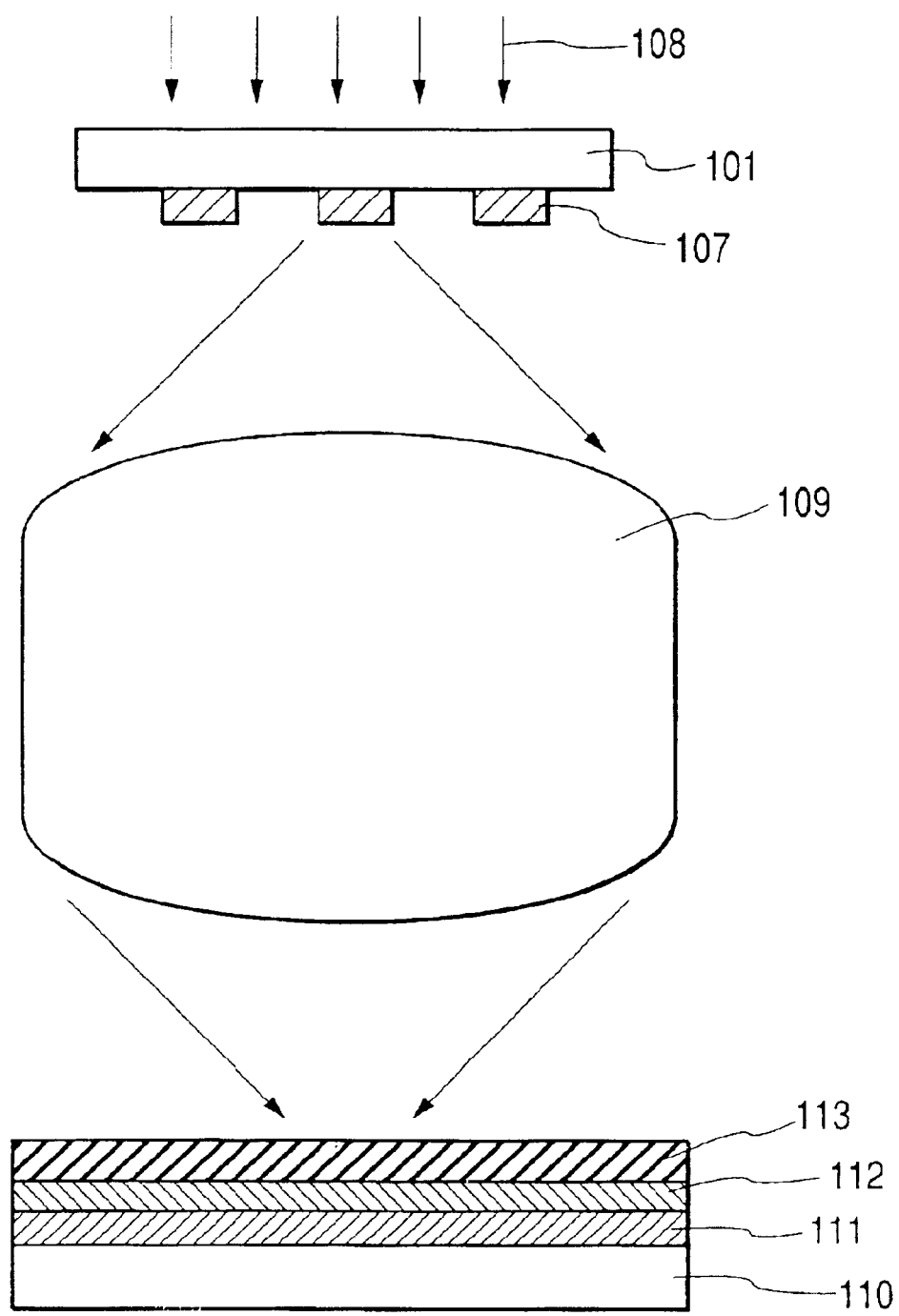
FIG. 1 is an explanatory diagram illustrating a constitution of this invention.

This invention is explained more specifically with reference to examples but the invention is not restricted to those examples.

Photosensitive Resin Composition Example 1

100 parts by weight of a phenolic compounds compound TPPA 1100-3C (manufactured by Honshu Chemical Industry Co.) as an aqueous alkali soluble resin matrix, 10 parts by weight of hexamethoxy methyl melamine (HMMM) as a crosslinker, 10 parts by weight of camphor sulfonyloxy naphthyl imide as an acid generator and 30 parts by weight of 9-anthracene methanol as a light absorption compound are dissolved in propylene glycol monomethyl ether, which is filtered through a teflon membrane filter of 0.2 μm pore size to prepare a solution of a negative type photosensitive resin composition. After dropping and spin-coating the solution on a silicon wafer, it was baked at 100° C. for 2 min to obtain a coating film of 0.32 μm thickness. After delineating a test pattern by an electron beam exposure system (acceleration voltage for electron beam; 30 kV) when developing is conducted for 40 sec by using an aqueous solution of tetramethyl ammonium hydroxide (2.38%) as a developing solution, a favorable negative type pattern is obtained for an electron beam irradiation dose of 6.0 μC/cm². Further, after forming a coating film by a spin-coating method on a quartz glass plate of 1 μm thickness and heating the film on a hot plate at 100° C. for 10 min (when the light absorption is measured at a wavelength of 248 nm), the extinction coefficient k is 0.28. The extinction coefficient k is a value defined by:

$$k = -\lambda \cdot ln(T)/(4\pi \cdot d)$$

where T represents a transmittance of a light at a wavelength of λ through a film of thickness d. The k indicates a physical amount of light absorption.

The k is identical with the imaginal part of a complex index of refraction.

Photosensitive Resin Composition Example 2

When blending 9-anthracene methanol in the photosensitive Resin Composition Example 1 from 30 parts by weight to 15 parts by weight, the extinction coefficient k of the obtained negative type pattern at a wavelength of 248 nm is 0.12 min.

Photosensitive Resin Composition Example 3

Phenolic compounds compound TPPA-1000-P (manufactured by Honshu Chemical Industry Co.) and 9-chloromethyl anthracene react in dimethyl sulfoxide under the presence of potassium hydroxide to obtain an aqueous alkali soluble phenolic compounds compound, to which an anthracene methyl structure is added. The dissolving rate of the coating film in an aqueous solution of tetramethyl ammonium hydroxide (2.38%) is 82 nm/s. Further, tris(4-hydroxyphenyl)methane and 2-chloroethyl vinyl ether react in dimethyl sulfoxide under the presence of sodium hydroxide to obtain a tri-functional vinyl ether compound, in which all of hydrogen atoms in three hydroxyl groups of tris(4-hydroxylphenyl) methane are substituted by ethyl vinyl ether groups. The phenolic compounds compound to which the anthracene methyl structure is added and the polyfunctional vinyl ether compound are reacted in 1,4-dioxane using pyridinium p-toluene sulfonate as the catalyst to obtain a white solid resin. 100 parts by weight of the white solid resin and 4 parts by weight of a tri-substituted ester of pyrogallol, and ethane sulfonate are dissolved in 2-heptanone to prepare a solution, which is filtered by a Teflon membrane filter of 0.2 μm pore size to obtain a positive type photosensitive resin solution. After dripping and spin-coating the solution on a silicon wafer, it is baked at 100° C. for 2 min and, after delineating a test pattern by an electron beam exposure system (acceleration voltage of electron beam: 30 kV), it is heat treated at 100° C. for 2 min. When developing is conducted by using an aqueous solution of tetramethyl ammonium hydroxide (2.38%) as a developing solution for 60 min, the film reduction for the non-exposed portion is not observed at all and a favorable positive type pattern is obtained at an electron beam irradiation dose of 7.0 μC/cm². Further, the extinction coefficient k at a wavelength of 248 nm of the positive type photosensitive polymer layer coated on a quartz glass plate is 0.26.

Embodiment 1

Figure 2A:
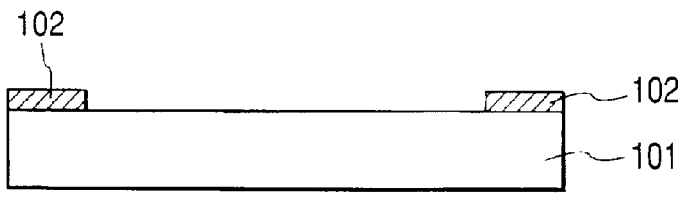
FIG. 2 is a set of sequential cross sectional views showing manufacturing steps of a photomask for KrF excimer laser lithography with an organic resin shade film according to this invention.

An example of a method of manufacturing a photomask for KrF excimer laser lithography using a negative type photosensitive resin composition formulated in the Photosensitive Resin Composition Example 1 is explained with reference to the drawings. FIG. 2(a) to FIG. 2(e) schematically show cross sectional views for the steps of manufacturing a photomask for KrF excimer laser lithography according to this invention. FIG. 2(a) represents a cross sectional view of a photomask substrate used in this invention. 101 denotes a quartz glass substrate and 102 denotes a peripheral area shade film of the substrate comprising a metal film, such as Cr, disposed previously. The portion does not form a circuit pattern transfer area in the lithographic step. The photomask substrate in a state before forming the circuit pattern is referred to as a blank.

Figure 2B:
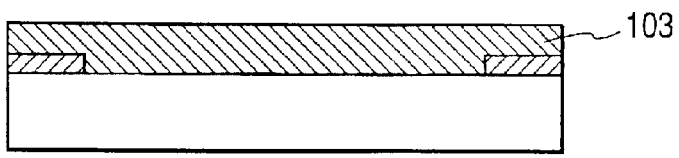

FIG. 2(b) shows a cross section in which the negative type photosensitive resin composition formulated in Photosensitive Resin Composition Example 1 is coated. In this step, the negative type photosensitive resin composition is coated by a spin-coating method and baked by a hot plate controlled at a temperature of 100° C. to form a photosensitive resin composition layer 103 of 0.5 μm thick.

Figure 2C:
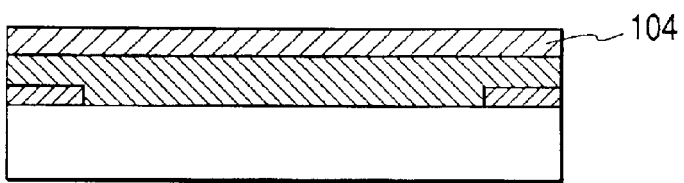

Then, as shown in FIG. 2(c), a water soluble conductive film 104 for preventing pattern shift due to charge up by an electron beam 105 is coated.

Figure 2D:
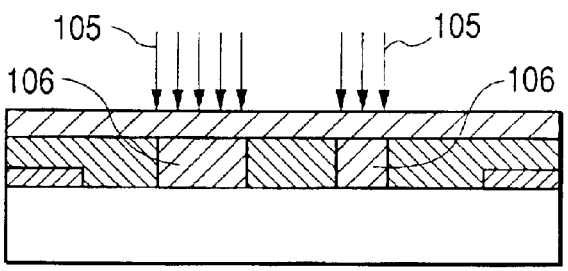
Figure 2E:
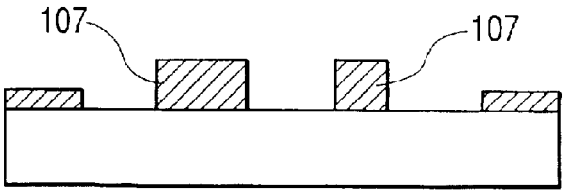

FIG. 2(d) is a schematic cross sectional view of irradiating the electron beam 105 in a desired pattern shape by an electron exposure system to form a desired pattern of latent images 106 to the photosensitive resin layer 103. In this step, the acceleration voltage of the electron beam is 50 kV and irradiation dose is 6 μC/cm$^2$. The substrate taken out of the electron beam irradiation tool is baked by a hot plate controlled at a temperature of 100° C. for 10 min and then developed for 40 sec with an aqueous 2.38% solution of tetramethyl ammonium hydroxide. Then, after rinsing with ionized purified water and dried to obtain a desired negative type pattern 107 as shown in FIG. 2(e). A line & space pattern of 0.8 μm is resolved favorably on blanks (0.8 μm), which provides a fine fabrication size of 0.16 μm on a semiconductor substrate in steps of repeating KrF excimer laser exposure. The transmittance of the thus formed negative type pattern area at a wavelength of 248 nm is 0.3%. The thus obtained photomask has a transfer performance comparable with that of a usual shade film made of metal, such as Cr, of a photomask for KrF excimer laser lithography.

In this mask, since there is no Cr etching processing for a circuit pattern (requiring etching at high accuracy), the mask manufacturing time is short, and fewer defects are formed. Since there is also less degradation in the dimensional accuracy by etching, the mask in-plane accuracy is high, pattern coarseness/closeness of the size and the pattern dependence are small, and a mask of a high fidelity to design is manufactured.

While the electron beam exposure is adopted in this embodiment, an Ar ion laser at a wavelength of 363.8 nm may also be adopted as an excimer laser. The photosensitive resin composition according to this invention has a light absorption band in the wavelength area of the KrF excimer laser beam with the light absorption compound. Accordingly, the pattern exposure is not suitable to the resolution of a fine pattern in this area. For the composition according to this invention, a favorable opaque pattern is formed by using UV-lights at a transmittance of 40% or more through the resist film for pattern exposure. The laser writing/pattern-generating avoid causing charge up and reduces heat accumulation during exposure. Accordingly, it is not necessary to form additionally a conductive film in the case of the laser writing.

This embodiment adopts a negative type pattern formation, and the negative type pattern formation has the following advantages. When a positive type photosensitive resin (resist) pattern is formed on a photomask substrate for a positive film pattern, non-exposed resin coating layer remains as it is at the periphery of the substrate relative to the central portion of the substrate in which a desired pattern is formed. If a resin layer is more fragile than the material of the quartz glass substrate at the periphery of the substrate, peeling or scraping is caused by mechanical impacts upon mounting the substrate to an inspection tool or an exposure system. In the case of the negative type, since the un-exposed resin layer at the periphery is removed automatically along with development, such problems are eliminated.

Further, in this embodiment, the peripheral region shade film of the substrate is previously formed to the quartz glass substrate with a permanent film made of metal, such as Cr. Such a mask substrate has a feature that the organic resin opaque pattern can be removed, and the substrate can be recycled after use. Further, while an alignment mark for the exposure system is formed in the Cr frame (peripheral area shade film of the substrate) and a light of a longer wavelength, for example, 660 nm, is used as a mark detection light in a certain exposure system. When the mark is formed by a metal, such as Cr, the mark can be detected at a high contrast. In one certain exposure system, the mark is detected by using the irradiation light, i.e., a KrF excimer laser beam. When such an exposure system used, the peripheral area shade film of the substrate can be formed by using the resist in this embodiment. In this case, a blank may be a single quartz glass substrate, and the cost is reduced.

Further, in this embodiment, the transmittance of the shade film to the KrF excimer laser beam is 0.3%. When evaluation is made while changing the resist film thickness, a half tone effect occurred in a state with no phase control if the transmittance exceeded 1% to bring about a problem that the fidelity of the pattern size on the wafer is lowered relative to the designed size. At the transmittance of 1% or less, there is no problem in a case where no particularly high dimensional accuracy is required, for example, in the case of wirings. It can be seen that the transmittance may be 0.5% or less in a case where high dimensional accuracy is required as in the case of the gate.

Embodiment 2

Figure 3:
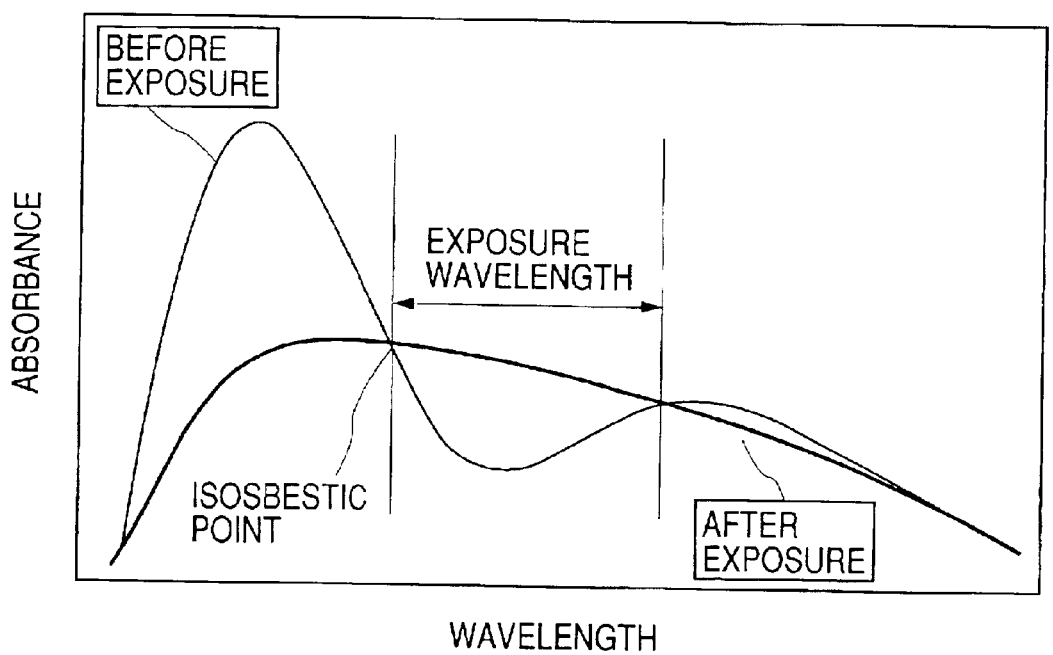
FIG. 3 is a characteristic graph showing the change of absorption spectrum before and after exposure of an organic resin composition layer.

When a predetermined negative pattern is formed on blanks in accordance with the steps described for Embodiment 1, the transmittance of the negative type pattern of 0.41 μm thick formed at a wavelength of 248 nm is 8.5%. The resolution of the pattern formed on the blanks is equivalent to that of Embodiment 1. The refractive index of the material to a light at 248 nm is 1.9, and the thickness of the film provides a phase difference 3 π. Accordingly, this functions as a half tone phase shift mask. Actually, the obtained photomask has a transfer performance comparable to that of the half tone type phase shift mask for KrF excimer laser lithography. In the half tone type phase shift mask, when the transmittance of the shade portion changes during use which causes a problem in view of the effect. However, the transmittance of the photomask in this embodiment showed no substantial change when irradiating the KrF excimer laser beam at about 100 J/cm$^2$. When long time exposure is applied to the organic resin film having an absorption band in an exposure wavelength area as in FIG. 3. The exposure causes a photochemical reaction and results in change of the absorption spectrum. In the resin composition used in this invention, since the exposure wavelength is extremely near to "isosbestic point" in the absorption spectral change, there is no substantial transmittance fluctuation. FIG. 3 is a schematic view for the absorption spectral change before and after exposure. In the change of the absorption spectrum is caused by photochemical reaction, and there is a point where the absorption spectrum of the starting substance and the absorption spectrum of the product overlapping. This is referred to as the isosbestic point at which the absorption does not change along with the amount of exposure.

Using the anthracene derivative as the light absorption compound, the isosbestic point exists near the wavelength of the KrF excimer laser beam which is effective for manufacturing a half tone type phase shift mask. When it is intended as a substitute shade film for the usual shade film made of metal such as Cr, it is desirable to avoid the wavelength area where the absorption decreases greatly before and after the exposure and to set the wavelength region where the absorption rather increases as an irradiation light wavelength area as shown in FIG. 2. In this embodiment, the film thickness is set such that the phase difference between the film and the window is $3\pi$, and it can be demonstrated by changing the film thickness and the blending amount of 9-anthracene methanol that the half tone phase shift effect is obtained when the phase difference is within a range of $\pm 10°$ relative to the phase inversion.

Further, the transmittance at a wavelength of 248 nm is 8.5% in this embodiment. A relation between the transmittance and the effect of the transfer pattern is examined by changing the film thickness so as to cause phase inversion and by changing the blending amount of 9-anthracene methanol. As a result, the half tone phase shift effect is obtained within a range of the transmittance of 2% to 16%. No sufficient improvement of the resolution is confirmed at the transmittance less than 2%. When it exceeded 16%, undesired effect of sub-peaks appear so as to cause a portion to be shaded to be exposed. The problem of the sub-peaks can be avoided by arranging a fine auxiliary pattern less than the resolution of the shade area. But the auxiliary pattern has to be disposed by a great number and in various patterns if it exceeded 16%, which is not practical. Within a range from 4% to 9%, the auxiliary pattern is avoided. Even if the auxiliary pattern is used, only a single type of pattern width is necessary in the pattern layout.

Embodiment 3

A photomask in a predetermined hole pattern is prepared in accordance with the steps described for Embodiment 1 by using a positive type photosensitive resin composition formulated in the Photosensitive Resin Composition Example 3 instead of the Photosensitive Resin Composition Example 1. In this process, a step of previously removing the resin layer on the peripheral region shade film at the ends of the substrate with a solvent after forming the photosensitive resin layer 103. This could prevent occurrence of obstacles caused by peeling or scraping due to mechanical impacts in subsequent mounting to the exposure system. A hole pattern of 1.0 $\mu$m square at a photosensitive resin layer 103 on blanks of 0.5 $\mu$m thick could be obtained favorably by using an electron beam exposure system for mask pattern-generating at an acceleration voltage of 50 kV and with an irradiation dose of 12 $\mu$C/cm$^2$, applying baking after exposure at 100° C. for 10 min, developing in an aqueous 2.38% solution of tetramethyl ammonium hydroxide for 60 second, and rinsing with ionized purified water, followed by drying. This provides fine fabrication size of 0.2 $\mu$m on a semiconductor substrate in a 5:1 step and a repeating KrF excimer laser exposure system. In this case, film reduction in the non-exposure area is not observed. Further, the transmittance of the film residual portion at a wavelength of 248 nm is 0.4%.

The positive type is particularly effective for defects formed in a dark field region which occupies most of the area in the hole pattern. That is, even if obstacles were placed on the mask, they do not form mask defects so long as they are present on the dark field.

Embodiment 4

A predetermined opaque pattern is formed in accordance with the steps of Embodiment 1 except for forming a predetermined substrate engraved type phase shift pattern by usual electron beam lithography and dry etching technique on the blanks previously. The resulted photomask has a transfer performance comparable that of the Levenson type phase shift mask for KrF excimer laser lithography.

Embodiment 5

The KrF excimer laser lithography using usual photomasks having opaque patterns made of metal, such as Cr, is applied except for the gate processing step of a semiconductor integrated circuit device, and the photomask prepared in accordance with Embodiment 1 is applied for the processing of the wiring layer in the upper layers. Further, the photomask for use in hole pattern manufactured in accordance with Embodiment 3 is applied to the processing of the through hole layer between wiring layers. Each of the manufactured photomasks is mounted with a pellicle for protecting the opaque pattern forming surface in the same manner as in the usual photomasks. The photomasks are mounted to a KrF excimer laser stepper having a numeral aperture (NA) of 0.6 and a reduction rate of ⅕. A predetermined wiring pattern formed on the photomask is transferred to a positive type resist for KrF excimer laser lithography coated on the semiconductor wafer. The positive type resist pattern on the wafer after the development has a quality comparable to that of the usual photomask. By applying the photomask manufactured in Embodiment 1 as the photomask for the wiring layer regardless of plural kinds difference in the specification of the wiring layers up to the manufacturing of a gate layer, the manufacturing cost per kind is decreased greatly compared with the case of manufacturing photomasks having usual opaque patterns made of metal, such as Cr.

Embodiment 6

The KrF excimer laser lithography using usual photomasks having usual opaque patterns made of metal, such as Cr, and Levenson type phase shift masks are applied up to the gate processing step of the semiconductor integrated circuit device, and a half tone type phase shift mask manufactured in accordance with Embodiment 2 is applied to a portion of the device for processing wiring layers in the upper layers. The thus manufactured half tone type phase shift mask is mounted with a pellicle for protecting the opaque pattern forming surface as the existent half tone type phase shift mask. The photomasks are mounted to a KrF excimer laser stepper with a numeral apertures (NA) of 0.6 and a reduction rate of ⅕. A predetermined wiring pattern formed on the photomask is transferred to a positive type resist for KrF excimer laser lithography coated on the semiconductor wafer. As a result, the positive type resist pattern on the wafer after the development shows no transfer defects by sub-peaks, which provides a fine wiring pattern of 0.2 $\mu$m and has a quality comparable to that using existing half tone type phase masks. Since the photomask prepared in accordance with the Embodiment 1 and the half tone type phase shift mask prepared in accordance with Embodiment 2 are applied as the photomasks for the wiring layers regardless of plural kinds differences in the specification of the wiring layers up to the gate layer, the manufacturing cost per kind is decreased greatly compared with the case of manufacturing photomasks having usual opaque patterns made of metal, such as Cr.

Embodiment 7

The KrF excimer laser lithography with the Levenson type phase shift mask formed in accordance with Embodiment 4 is applied to the gate processing step of a semiconductor integrated circuit memory device. A phase shift pattern for the repeative pattern areas of a region corresponding to the memory mat area is prefabricated on the photomask substrate, and the opaque pattern of the region and the opaque pattern corresponding to the predetermined pattern of the peripheral circuit region are prepared by using the photosensitive organic resin composition of this invention. Accordingly, since the expensive phase shift pattern is reutilized by the peeling of the resin opaque pattern relative to the change of the peripheral circuit design, the cost and the time required in development is reduced remarkably.

Embodiment 8

When a predetermined negative pattern is formed on blanks in accordance with the steps described for Embodiment 1 by using Photosensitive Resin Composition Example 1, the transmittance of the negative pattern area formed of 0.14 μm thick is 14% at a wavelength of 248 nm. The refractive index of the material to a light at a 248 nm is 1.9, and the film thickness provides a phase difference π. Accordingly, it functions as a half tone phase shift mask. A portion where the sub-peaks are formed is predetermined by optical simulation, and an auxiliary pattern (fine aperture pattern less than the resolution limit) is laid out on the mask. As a result, a high resolution is obtained.

Embodiment 9

A ninth embodiment is to be explained with reference to FIG. 1. In FIG. 1 are shown a quartz glass 101, a resist 107, an irradiation light (KrF excimer laser beam) 108, a projection range 101, a wafer 110, an overcoat layer 111, an anti-reflecting film 112, and a resist 113. While the photomask described for Embodiment 1 is used here, photomasks in Embodiments 2, 3 or 4 may also be used instead. An oxide film is used as the overcoat layer 111 for instance, but a metal film, such as of W or Al, a polysilicon film, a nitride film, or a carbide film may also be used instead. While a coated type organic film is used as the anti-reflecting film 112, an inorganic film, such as SiON, may also be used instead. Further, the anti-reflecting film may be eliminated although the transfer dimensional accuracy will be somewhat lowered. A chemical amplification type resist using a phenolic resin as a base resin is used for the resist 113 on the wafer. The important feature of this embodiment is that both the resists 107 and 113 are resists containing benzene rings while a KrF excimer laser beam is used for the irradiation light. The resist on the photomask sufficiently blocks the KrF excimer laser beam, and also has light stability. Since the resist has a phenolic resin base containing benzene rings, this is a photosensitive composition of favorable resolution without development swelling and with high developing contrast. On the other hand, since the resist on the wafer is also a resist having a phenolic resin base containing benzene rings, it has high etching resistance. Actually, when a resist pattern is formed by development after exposure, and pattern transfer is conducted on the anti-reflecting film 112 and the overcoat layer 111 by dry etching, there is no surface or side wall toughness, and the pattern could be transferred at high accuracy to the overcoat layer.

The above-mentioned prior art reference JP-A-289307/1993 uses a resist containing benzene rings in the shade film of the photomask in the same manner as in this embodiment, but it is intended for exposure with an ArF excimer laser beam or an irradiation light at a shorter wavelength in view of the shading characteristic, in which acrylic or alicyclic resist is used as the resist for the overcoat layer on the wafer in view of the wavelength of the irradiation light. The resist is inferior to the benzene ring type resist in view of the etching resistance, and it involves a problem of large roughness on the etching surface and the side walls to the oxide film. Such problems are overcome by the embodiments according to this invention.

Embodiment 10

The tenth embodiment concerns the production of a semiconductor integrated circuit device having a twin well system CMIS (Complementary MIS) circuit, which is explained with reference to FIG. 4.

FIG. 4 is a set of cross sectional views of a main portion of a semiconductor wafer in the manufacturing steps. A semiconductor substrate 3s constituting a semiconductor wafer comprises, for example, an n-type Si single crystal of a circular plane. An n-type well 6n and a p-type well 6p are formed on the wafer. Phosphorus or As as the n-type impurity is introduced to the n-type well 6n, and boron is introduced to the p-type well 6p as the p-type impurity. The n-type well and the p-type well are formed as described below. At first, a wafer alignment mark (not illustrated) is formed for mask alignment on the semiconductor substrate 3s. The wafer alignment mark is prepared also upon forming the well by adding a selective oxidation. Subsequently, as shown in FIG. 4(a), an oxide film 17 is formed on the semiconductor substrate 3s, then a resist pattern 18 for use in an implantation mask is formed on the oxide film 17. Subsequently, phosphorus is ion implanted. A KrF excimer laser exposure system and a photomask for KrF excimer laser lithography having the resist pattern described in Embodiment 1 as a shade film are used for forming the resist pattern 18 for use as an implantation mask.

Since the minimum pattern width is 2 μm in this step, an i-line lithography is usually used, but KrF excimer laser lithography is used instead in this embodiment. This has an advantage that the alignment accuracy is improved by using the same KrF excimer laser exposure system for isolation or gate formation. Further, for debug application where the number of devices to be manufactured is small, there is also an effect of reducing the device by restricting the number of the KrF excimer laser exposure. A non-chemical amplification type positive resist comprising a phenolic resin sensitive to KrF excimer laser and a photosensitizer is used as the resist on the wafer. The phenolic resin contains benzene rings. The resist made of the phenolic resin has high implantation resistance and thus is suitable as an implantation resist. The film is of 1 μm thick.

Figure 4A:
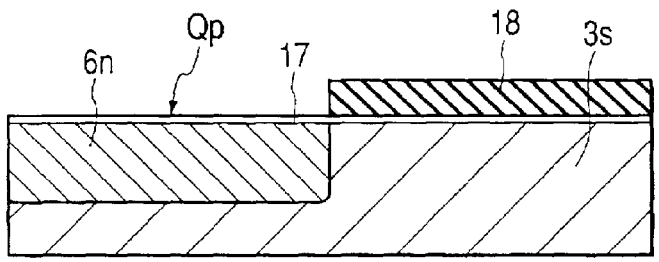
FIG. 4 is a set of sequential cross sectional views of a main portion of a semiconductor wafer during the production steps of a semiconductor integrated circuit device.
Figure 4B:
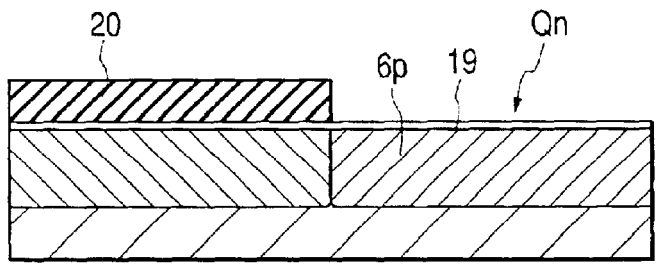

Subsequently, after removing the resist 13 by ashing and removing the oxide film 17, an oxide film 19 is formed on the semiconductor substrate 3s as shown in FIG. 4(b), and successively, a resist pattern 20 for ion implantation mask is formed on the oxide film 19. Subsequently, phosphorus is ion implanted. Also for forming the resist pattern 20 for use in ion implantation mask, a KrF excimer laser exposure system and a photomask for KrF excimer laser lithography having the resist pattern defined in Embodiment 1 as the shade film are used also for forming the resist pattern 20 as an ion implantation mask. In this step, the minimum pattern width is 2 μm.

Figure 4C:
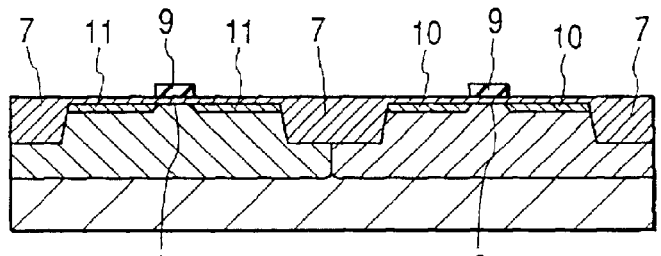
Figure 4D:
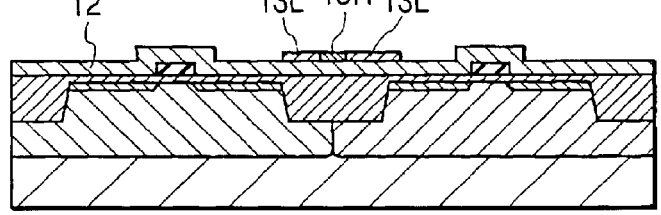
Figure 4E:
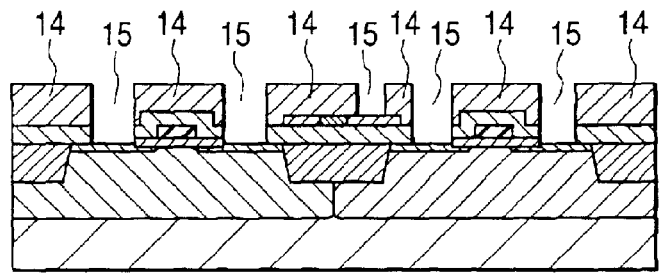
Figure 4F:
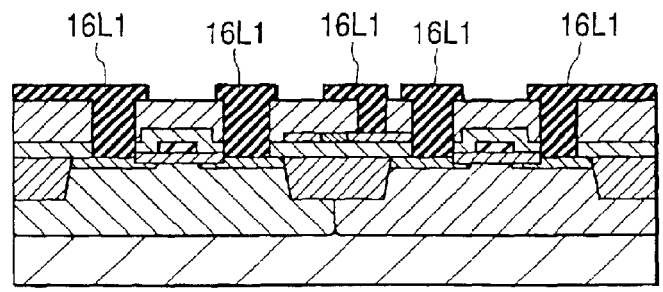

Subsequently, the resist 20 and the oxide film 19 are removed, and a field insulation film 7 comprising, for example, a silicon oxide film is formed to provide a "trench" or "groove" type isolation on the main surface (first main surface) of the semiconductor substrate 3s (FIG. 4(c)). A LOCOS (Local Oxidization of Silicon) method may also be used as the isolation method. However, the LOCOS method has a problem that the layout size is enlarged, for example, due to the extension of the bird's beak. For applying lithography during manufacturing the isolation, the KrF excimer laser exposure system and the photomask having the resist pattern described in Example 1 (as a shade film) is used.

In the active regions surrounded with the field insulation film 7, an nMIS Qn and a pMIS Qp are formed. The gate insulation film 8 for the nMIS Qn and the pMIS Qp comprises, for example, of a silicon oxide film and is formed by thermal oxidation method or the like. Further, the gate electrode 9 of the nMIS Qn and the pMIS Qp is formed, for example, by depositing a gate forming film comprising polysilicon of low resistivity by a CVD method or the like, and then applying lithography to the film by the KrF excimer exposure step with the photomask having the resist pattern defined in Embodiment 1, and then applying etching. The gate electrode 9 could be also formed by applying lithography by using the KrF excimer laser exposure system and a phase shift type photomask having the resist pattern defined in any one Embodiments 2, 3, 4 and 8 (as a shade film).

The semiconductor region 10 for the nMIS Qn is formed by self alignment relative to the gate electrode 9 by introducing, for example, phosphorus or arsenic, with an ion implantation method or the like, to the semiconductor substrate 3s, and using the gate electrode 9 as a mask. Further, the semiconductor area 11 of the pMIS Qp is formed by self alignment relative to the gate electrode 9 by introducing, for example, boron, with an ion implantation method, to the semiconductor substrate 3s using the gate electrode 9 as a mask. The gate electrode 9 may be formed not only with a single film of low resistivity polysilicon but also by various modified structures. For example, it may be formed as a so-called polycide structure by disposing a silicide layer, such as tungsten silicide or cobalt silicide, on a low resistivity polysilicon film, or as a so-called polymetal structure formed by disposing a metal film, such as of tungsten, on a low resistivity polysilicon film by way of a barrier conductive film, such as titanium nitride or tungsten nitride.

At first, as an example, an interlayer insulation film 12 comprising, for example, a silicon oxide film on the semiconductor substrate 3s by CVD or the like, a polysilicon film is deposited on the upper surface thereof by a CVD or the like. Successively, wirings 13L and resistor 13R comprising the polysilicon film are formed by applying lithography to the polysilicon film using the KrF excimer laser exposure system and the photomask having the resist pattern described above as a shade film, patterning the same by etching, and then introducing impurities to the predetermined area of the patterned polysilicon film. A chemical amplification type resist having a phenolic resin sensitive to the KrF excimer laser beam is used as the base resin. The resist having the phenolic resin as the base resin has a high etching resistance so as to obtain high processing accuracy. Since the required pattern size and the accuracy of the wiring layers are more moderate than those of the gate, the cost is reduced by using the KrF excimer laser exposure at a lower cost than the ArF excimer laser exposure. Whether to use the ArF excimer laser exposure or the KrF excimer laser exposure depends on the balance of a required minimum size, a required dimensional accuracy, and the cost. In a case of forming the pattern by using the ArF excimer laser, a photomask having a general-purpose chemical-amplification-type electron beam resist of novolak resin or phenolic resin is used as a shade film. Using the generally-purpose resist reduces the resist cost. In a case of ArF exposure, an acrylic-chemical-amplification-type resist or alicyclic-chemical-amplification-type resist is used as the resist on the wafer. The resist containing benzene rings could not be used as the resist for the wafer since the light transmittance is low.

Subsequently, as shown in FIG. 4(*e*), after depositing, for example, a silicon oxide film 14 by a CVD method or the like, lithography is applied for etching and perforating with the KrF excimer laser exposure system and the halftone type phase shift mask having the resist pattern of Embodiment 8 described above (as the attenuator to form contact holes 15) so as to expose a portion of the semiconductor regions 10 and 11, a portion of the wirings 13L in the interlayer insulation film 12, and the oxide silicon film 14. A chemical amplification type resist containing the phenolic resin sensitive to the KrF excimer laser (as the base resin) is used as the resist on the wafer.

The KrF excimer laser exposure is used here since the hole diameter of the contact hole is 0.18 μm. If the diameter is required to be smaller than 0.15 μm, the ArF excimer laser exposure may be used, because it is difficult to stably resolve the diameter of 0.15 μm or less by the KrF excimer laser exposure. Then, the chemical amplification type electron beam resist with a novalak resin for phenolic resin sold for general purposes is used as the shade film of the photomask.

Further, after depositing a metal film comprising titanium (Ti), titanium nitride (TiN), and tungsten (W) on the semiconductor substrate 3s successively by the sputtering method and the CVD method, lithography is applied for etching the metal film with the KrF excimer laser exposure system and the photomask having the resist pattern of Example 1 described above (as the shade film). A first layer wiring 16L1 is formed as shown in FIG. 4(*f*). For the resist on the wafer, a chemical amplification type resist containing a phenolic resin sensitive to the KrF excimer laser beam is used as the base resin.

Subsequently, the second wiring layer and succeeding layers are formed in the same manner as for the first wiring layer 16L1 to manufacture the semiconductor integrated circuit device. The KrF excimer laser exposure is used herein since the wiring pitch is 0.36 μm. The ArF excimer laser exposure is used when forming a wiring pattern of 0.3 μm or less with respect to the resolution. A chemical amplification type electronic beam resist with a novolak resin or a phenolic resin sold for general purposes is used as the shade film of the photomask for KrF excimer laser exposure.

For the custom LSI products, mask debug is often applied mainly for the first wiring layer. Since the speed of the mask feed TAT for the first wiring layer determines the product development performance and a number of photomasks are necessary, application of the invention to this step is particularly advantageous. Further, the minimum pattern size in the second wiring layer is 0.35 μm (pattern pitch: 0.8 μm) which is sufficiently larger than the exposure wavelength (0.248 μm). Then, the photomask for KrF excimer laser lithography having the resist pattern of Example 1 of this invention (as the shade film)is applied.

The cost is reduced, and the TAT is shortened compared with the Cr mask, by using the photomask having the resist pattern of this invention as a shade film. The existing photomasks using the resist as the shade film are not suitable for KrF excimer laser exposure. But a photomask using the resist directly as the shade film can be generally used for KrF excimer laser exposure according to this invention, which greatly extends the application range.

According to one embodiment of this invention, since the opaque pattern of the photomask for KrF excimer laser lithography can be formed directly by the developing treatment, the etching step for the shade film or the removing step for the resist are no longer necessary, and it is possible to reduce cost, improve the dimensional accuracy, and reduce the defects on the photomask. Further, depending on the requirement, since the photomask at a reduced cost and with shortened manufacturing time is available, semiconductor integrated circuit devices of smaller size, and various kinds can be manufactured in a short period of time at a reduced cost.

The foregoing invention has been described in terms of preferred embodiments. However, those skilled in the art will recognize that many variations of such embodiments exist. Such variations are intended to be within the scope of the present invention and the appended claims.

What is claimed is:

1. A photomask for KrF excimer laser lithography having a shade film comprises a photosensitive polymer layer formed in a desired pattern on a quartz glass substrate, wherein the polymer layer is sensitive to an electron beam, and the transmittance of the KrF excimer laserbeam by the polymer layer is 1% or less.

2. The photomask according to claim 1, wherein the transmittance of the KrF excimer laser beam by the shade film is 0.5% or less.

3. The photomask according to claim 1, having a phase shifter for shifting a phase of the KrF excimer laser beam in a predetermined pattern by 180° on the quartz glass substrate.

4. The photomask according to claim 1, wherein the photosensitive polymer layer contains light absorbent for KrF excimer laser.

5. The photomask according to claim 4, wherein the light absorbent is chemically bonded to composition of the photosensitive polymer layer.

6. A photomask for KrF excimer laser lithography having an attenuator comprises a photosensitive polymer layer formed in a desired pattern on a quartz glass substrate, wherein the polymer layer is sensitive to an electron beam, and the transmittance of the KrF excimer laser beam by the polymer layer ranges from 2% to 16%.

7. The photomask according to claim 6, wherein the transmittance of the KrF excimer laser beam by the polymer layer ranges from 4% to 9%.

8. The photomask according to claim 6, wherein the photosensitive polymer layer contains light absorbent for KrF excimer laser.

9. The photomask according to claim 8, wherein the light absorbent is chemically bonded to composition of the photosensitive polymer layer.

* * * * *